(12) United States Patent
Hoshino

(10) Patent No.: US 7,615,782 B2
(45) Date of Patent: Nov. 10, 2009

(54) THIN FILM TRANSISTOR SUBSTRATE AND LIQUID CRYSTAL DISPLAY PANEL HAVING SUB-PIXELS

(75) Inventor: Atsuyuki Hoshino, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 89 days.

(21) Appl. No.: 11/433,458

(22) Filed: May 15, 2006

(65) Prior Publication Data
US 2007/0090361 A1    Apr. 26, 2007

(30) Foreign Application Priority Data
May 16, 2005   (JP) .............................. 2005-142770

(51) Int. Cl.
*G02F 1/1368* (2006.01)

(52) U.S. Cl. ................... 257/59; 257/72; 257/E29.117; 257/E29.151; 257/E29.273; 257/E29.299; 438/164; 349/42; 349/43; 349/48

(58) Field of Classification Search .......... 257/E29.117, 257/E29.151, E29.273, E29.299, 59, 72; 438/164; 349/42, 43, 48
See application file for complete search history.

(56) References Cited

U.S. PATENT DOCUMENTS

| | | | |
|---|---|---|---|
| 4,786,780 A | 11/1988 | Oakabe et al. | |
| 5,126,865 A | 6/1992 | Sarma | |
| 5,151,807 A | 9/1992 | Katayama et al. | |
| 5,483,082 A | 1/1996 | Takizawa et al. | |
| 5,926,161 A * | 7/1999 | Furuhashi et al. | ............ 345/100 |
| 2004/0094766 A1* | 5/2004 | Lee et al. | ........................ 257/72 |
| 2005/0036091 A1* | 2/2005 | Song | ........................... 349/129 |
| 2006/0103800 A1 | 5/2006 | Li et al. | |

FOREIGN PATENT DOCUMENTS

| | | | |
|---|---|---|---|
| JP | 63-262621 A | | 10/1988 |
| JP | 3-24524 A | | 2/1991 |
| JP | 3076938 B2 | | 3/1993 |
| JP | 3098345 B2 | | 7/1994 |
| JP | 9-179141 A | | 7/1997 |
| JP | 2002-287712 A | | 10/2002 |
| JP | 2006227109 A | * | 8/2006 |

* cited by examiner

*Primary Examiner*—Davienne Monbleau
*Assistant Examiner*—Christopher M Roland
(74) *Attorney, Agent, or Firm*—Birch, Stewart, Kolasch & Birch, LLP

(57) ABSTRACT

The present invention relates to a thin film transistor substrate and a liquid crystal display panel for use in a liquid crystal display apparatus, and aims to provide a thin film transistor substrate and a liquid crystal display panel with good display quality. The thin film transistor substrate has a first sub-pixel electrode 16 and second sub-pixel electrode 17 arranged on the opposite sides of the gate bus line 12, a first thin film transistor 20*a* that establishes direct electrical connection with the first sub-pixel electrode 16, and a second thin film transistor 20*b* capacitively coupled to the second sub-pixel electrode 17. Since capacitance is formed where conventionally a source electrode and pixel electrode are connected via a contact hole, excessively opaque wiring is not required, which ensures sufficient effective area and transmittance of a pixel.

8 Claims, 6 Drawing Sheets

THIN FILM TRANSISTOR SUBSTRATE AND LIQUID CRYSTAL DISPLAY PANEL HAVING SUB-PIXELS

BACKGROUND OF THE INVENTION

1. Field of the Invention

The present invention relates to a thin film transistor substrate and a liquid crystal display panel for use in a liquid crystal display apparatus.

2. Description of the Related Art

In recent years, liquid crystal display apparatus have been used in television receivers, monitors and the like. In particular, in a liquid crystal display apparatus equipped with a liquid crystal display panel using a thin film transistor substrate having a matrix arrangement of thin film transistors (TFTs) on an insulating substrate (hereinafter referred to as "TFT liquid crystal display panel"), it is desired to improve image display quality with increased spatial and image depth resolution.

A TFT liquid crystal display panel generally includes a thin film transistor substrate, a counter substrate facing the thin film transistor substrate, and a liquid crystal layer sandwiched therebetween. The TFT liquid crystal display panel controls the gray scale of the image to be displayed by applying a voltage across transparent electrodes formed on the substrates to tilt liquid crystal molecules and change the light transmittance. Recent growth in demand of liquid crystal display apparatus has diversified requirements therefor. Among others, there is a strong demand for improvements in viewing angle characteristics and display quality, and vertically aligned (VA) liquid crystal display apparatus emerges as a potential candidate to meet this demand.

A VA liquid crystal display apparatus is characterized by vertically aligned films provided on the opposing surfaces of the substrates and a liquid crystal layer with negative dielectric anisotropy therebetween. The VA liquid crystal display apparatus also has, for example, linear domain restrictors (projections or slits) on the substrates to provide multi-domain alignment. This allows the VA liquid crystal display apparatus to achieve excellent viewing angle characteristics and display quality.

Although in TFT liquid crystal display panels used in the VA type and other types of liquid crystal display apparatus, each pixel typically has one pixel electrode, a structure in which the pixel electrode is divided into a plurality of sub-pixel electrodes in one pixel is also known in the art. For example, Japanese Patent No. 3,076,938 discloses a configuration in which in a pixel region defined by a gate bus line and drain bus line, electrical potentials supplied to a plurality of sub-pixel electrodes through one TFT are changed by capacitive coupling. JP-A-63-262621, JP-A-3-024524, and JP-A-9-179141 disclose thin film transistor substrates and liquid crystal display apparatuses having sub-pixel electrodes divided by a gate bus line or drain bus line.

Multi-domain vertical alignment liquid crystal display apparatus, however, has a problem that the screen looks whitish when viewed from a diagonal direction, which is so-called "white-blurring". To address this problem, a method has been proposed in which the pixel electrode in one pixel is divided into a plurality of sub-pixel electrodes and distributed in a mixed manner such that some of the sub-pixel electrodes directly receive a gray level voltage through a pixel TFT and the other sub-electrodes have a predetermined voltage lower than the gray-level voltage due to capacitive coupling, which is a so-called capacitive half-tone driving method.

Japanese Patent No. 3098345 and JP-A-2002-287712 are exemplified as another related art documents.

However, the pixel structure used in the capacitive half-tone driving method has the following disadvantages. First, since a capacitive electrode for capacitively coupling the sub-pixel electrodes is formed of the same film in the pixel region as the opaque metal film forming the pixel TFT, the effective area of the pixel and hence the transmittance decrease due to the presence of the capacitive electrode. Second, to avoid such a problem, forming the capacitive electrode with a transparent electrode material increases the number of manufacturing steps. Third, insulation between the adjacent sub-pixel electrodes requires a slit region of a predetermined width, resulting in decreased effective pixel area by the amount of the slit width and hence decreased transmittance. Fourth, to avoid such a problem, decreasing the slit width may cause short circuit between the adjacent sub-pixel electrodes due to pattern defects during patterning of the sub-pixel electrodes. Fifth, the adjacent sub-pixel electrodes having different electrical potentials result in a complex pixel structure. Sixth, the complex pixel structure limits the freedom in pixel design.

SUMMARY OF THE INVENTION

An object of the invention is to provide a thin film transistor substrate and a liquid crystal display panel with good display quality.

The above object is achieved by a thin film transistor substrate comprising first and second bus lines intersecting each other with an insulating film therebetween and located above a transparent insulating substrate, first and second sub-pixel electrodes located on the opposite sides of the first bus line, a first thin film transistor that establishes direct electrical connection with the first sub-pixel electrode, and a second thin film transistor capacitively coupled to the second sub-pixel electrode.

In the above thin film transistor substrate of the invention, the first bus line is a gate bus line that establishes direct electrical connection with the gate electrodes of the first and second thin film transistors, and the second bus line is a drain bus line that establishes direct electrical connection with the drain electrodes of the first and second thin film transistors.

In the above thin film transistor substrate of the invention, a source electrode of the first thin film transistor establishes direct electrical connection with the first sub-pixel electrode, and a source electrode of the second thin film transistor is capacitively coupled to the second sub-pixel electrode via the insulating film.

In the above thin film transistor substrate of the invention, a part of the gate bus line also serves as the gate electrodes of the first and second thin film transistors, and the drain electrode is formed such that it protrudes from the drain bus line above the gate electrode when viewed toward the normal to the transparent insulating substrate and used as the common drain electrode of the first and second thin film transistors.

The above thin film transistor substrate of the invention further includes an independent electrode formed in the same layer as the gate bus line, the independent electrode forming capacitance with respect to the source electrode of the second thin film transistor with the insulating film as a capacitance film and establishing direct electrical connection with the second sub-pixel electrode.

The above thin film transistor substrate of the invention further includes an independent electrode formed in the same layer as the gate bus line, the independent electrode forming capacitance with respect to the source electrode of the second thin film transistor with the insulating film as a capacitance film and capacitively coupled to the second sub-pixel electrode.

In the thin film transistor substrate of the invention, the source electrode of the second thin film transistor and the second sub-pixel electrode form capacitance with an insulating film as a capacitance film, the insulating film covering the top of the second thin film transistor.

The above object is achieved by a liquid crystal display panel comprising the thin film transistor substrate of the invention, a counter substrate facing the thin film transistor substrate and having counter electrodes formed on a transparent insulating substrate, and a liquid crystal layer sandwiched between the thin film transistor substrate and the counter substrate.

According to the invention, there are provided a thin film transistor substrate and liquid crystal display panel with good display quality.

DESCRIPTION OF THE PREFERRED EMBODIMENTS

First Embodiment

Figure 1:
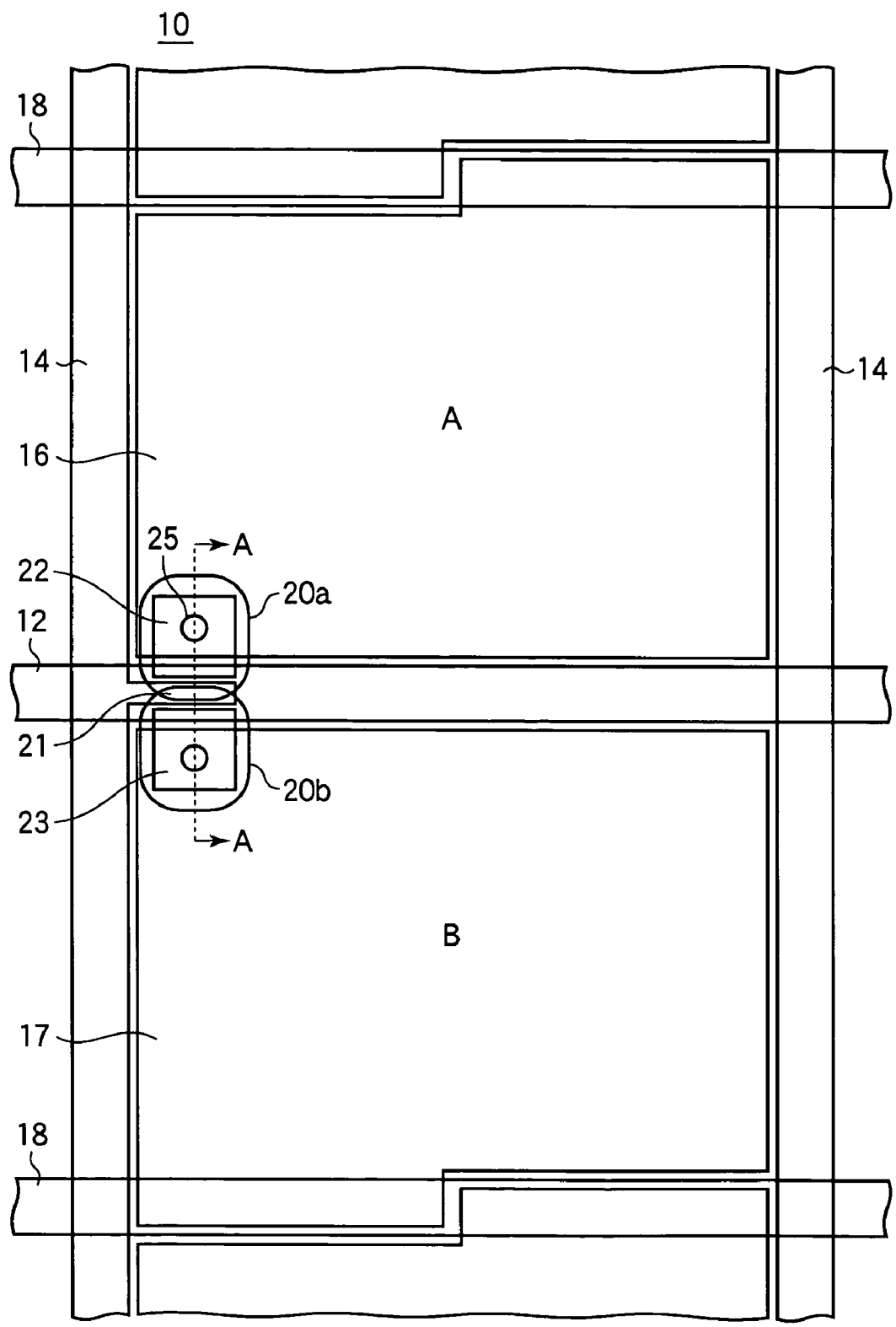
FIG. 1 shows the configuration of one pixel of the thin film transistor substrate according to the first embodiment of the invention.
Figure 2:
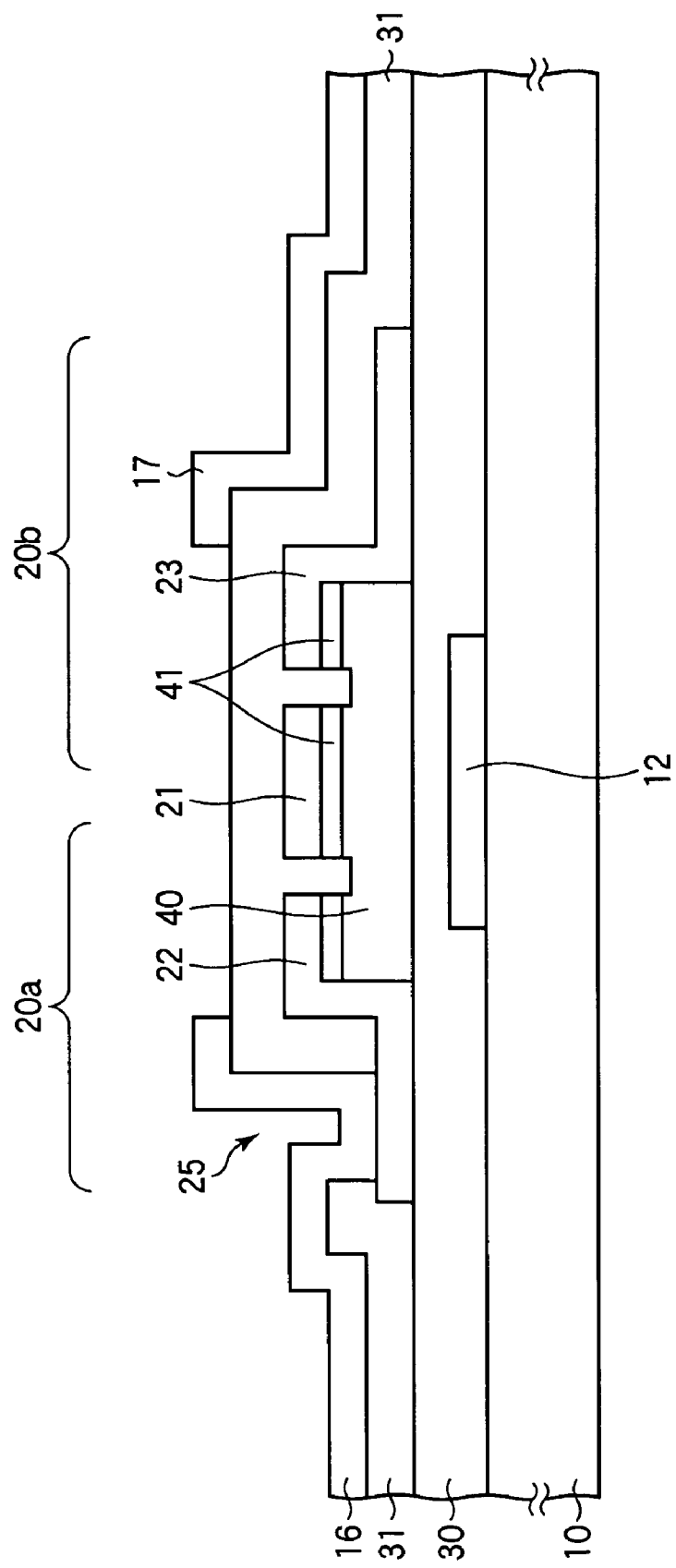
FIG. 2 shows in cross-section the configuration of one pixel of the thin film transistor substrate according to the first embodiment of the invention.

The thin film transistor substrate and liquid crystal display panel according to a first embodiment of the invention will be described with reference to FIGS. 1 and 2. FIG. 1 shows the configuration of one pixel of the thin film transistor substrate according to this embodiment. FIG. 2 is a cross-sectional view of the thin film transistor substrate taken along the line A-A shown in FIG. 1. As shown in FIGS. 1 and 2, the thin film transistor substrate includes a glass substrate 10, which is a transparent insulating substrate, having a plurality of gate bus lines 12 formed thereon. The gate bus line 12 is formed of Al (aluminum) and Mo (molybdenum) that are stacked in this order to form an Al/Mo layer. A silicon nitride insulating film 30 (which functions as a gate insulating film on a part of the gate bus line 12 and is hereinafter referred to as "gate insulating film") is formed on the glass substrate 10 and gate bus lines 12. A plurality of drain bus lines 14 are formed on the gate insulating film 30 such that they intersect the gate bus lines 12. Storage capacitive electrode bus lines 18 are also formed parallel to the gate bus lines 12, which are formed of the same Al/Mo layer as the gate bus lines 12.

In the configuration of one pixel according to this embodiment, sub-pixel regions A and B are formed on the opposite sides of the gate bus line 12. Alternatively, it is of course possible to arrange the sub-pixel regions A and B on the opposite sides of the drain bus line 14. In proximity to the intersection of the gate bus line 12 and drain bus line 14, at the positions indicated by two circles in FIG. 1, TFTs 20a and 20b (first and second thin film transistors) as switching devices are formed for the sub-pixel regions A and B respectively. The TFTs 20a and 20b share a common drain electrode 21 that is formed such that it protrudes from the drain bus line 14 and overlies the gate bus line 12 when viewed toward the normal to the panel surface. That is, the drain electrode 21 electrically connected to the drain bus line 14 serves as a drain electrode of both TFTs 20a and 20b. A part of the gate bus line 12 functions as a gate electrode of the TFTs 20a and 20b. A source electrode 22 of the TFT 20a is formed in the sub-pixel region A and apart from the drain electrode 21 by a given space. Similarly, a source electrode 23 of the TFT 20b is formed in the sub-pixel region B and apart from the drain electrode 21 by a given space. The drain bus line 14, drain electrode 21, and source electrodes 22, 23 are all formed of the same layer made of a Mo/Al/Mo film.

An island semiconductor layer 40, which may be an amorphous silicon (a-Si) layer, is formed on the gate insulating film 30 above a predetermined position of the gate bus line 12 as shown in FIG. 2. An ohmic contact layer 41 made of an n-type a-Si layer is formed on the island semiconductor layer 40. The source electrodes 22, 23 and drain electrode 21 are formed on the gate insulating film 30 and the island semiconductor layer 40. A silicon nitride insulating film (protective film) 31 is formed on the gate insulating film 30, source electrodes 22, 23, and drain electrode 21 across the substrate.

A sub-pixel electrode (a first sub-pixel electrode) 16 made of an ITO (indium tin oxide) film that is the material of a transparent pixel electrode is formed in the sub-pixel region A. A sub-pixel electrode (a second sub-pixel electrode) 17 made of the ITO film that is the same layer as the sub-pixel electrode 16 is formed in the sub-pixel region B. The sub-pixel electrode 16 in the sub-pixel region A establishes direct electrical connection with the source electrode 22 via a contact hole 25 formed in the insulating film 31 on the source electrode 22. The sub-pixel electrode 17 in the sub-pixel region B is capacitively coupled to the source electrode 23 via the insulating film 31 on the source electrode 23. The pixel electrode 17 overlaps with the source electrode 23 when viewed toward the normal to the panel surface, forming a capacitor with the insulating film 31 in the overlapping portion as a capacitance film.

Thus, the sub-pixel electrode 16 and sub-pixel electrode 17 are arranged facing each other on the opposite sides of the drain electrode 21 and the gate bus line 12. Parts of the sub-pixel electrode 16 and sub-pixel electrode 17 overlap with respective storage capacitive bus lines 18 via the gate insulating film 30, forming capacitance to the respective storage capacitive bus lines 18. The thin film transistor substrate having the pixel configuration described above is then attached to a counter substrate (not shown) with a liquid crystal layer interposed therebetween to complete the manufacture of a liquid crystal panel.

Examples of thin film transistor (TFT) structures include reverse stagger type TFTs and stagger type TFTs in which amorphous silicon (a-Si) is used for an operation layer, and coplanar type TFTs in which polycrystalline silicon (poly-Si) is used for an operation layer. Reverse stagger type a-Si-TFTs are further categorized into a channel protection film type (ISI) and a channel etch type (NSI) based on the difference in the channel structure. However, any of the TFTs mentioned above basically functions in the same manner as a TFT regardless of the difference in structure, as long as pixel electrodes are arranged on the insulating film that covers the TFT. This embodiment employs a channel etch type TFT.

In the production of channel etch type TFTs, a method has been proposed for reducing the number of photolithography processes. The method comprises patterning an a-Si layer and a metal layer for a source and drain with a single mask to form an island, the mask being a halftone exposure mask to provide a halftone exposure of only a channel portion to form a contrasted portion in the resist; and upon the formation of the island portion, removing the resist on the channel portion by partial ashing the resist to separate the elements.

A method for manufacturing the thin film transistor substrate and the liquid crystal display panel according to this embodiment will be described. First, Al is deposited on the glass substrate 10 of about 0.7 mm thick, to form a 150 nm thick film. Then, Mo is vacuum sputtered onto the Al to a thickness of 80 nm to form an Al/Mo stacked layer. The Al/Mo layer is photolithographically patterned and wet etched to form the gate bus lines 12, a part of which also serves as the gate electrode, and storage capacitive bus lines 18. Subsequently, using plasma CVD, a silicon nitride film (gate insulating film 30), an a-Si film, and P (phosphorus)-doped n-type a-Si film are grown across the substrate in this order to thicknesses of 400 nm, 100 nm, and 50 nm, respectively. Then, the a-Si film and n-type a-Si film are photolithographically patterned and dry etched into an island portion above the gate electrode, forming an island semiconductor layer 40 and an ohmic contact layer 41.

Then, Ti (titanium), Al, and Ti are vacuum sputtered in this order across the substrate to thicknesses of 20 nm, 75 nm, and 40 nm respectively to form a stacked film. The stacked film is photolithographically patterned and dry etched to form the source electrodes 22, 23 and the drain electrode 21. Then, the n-type a-Si layer 41 is dry etched away from the portion between the source electrode 22 and the drain electrode 21, as well as from the portion between the source electrode 23 and the drain electrode 21 above the island semiconductor layer 40 to separate the source electrode 22 and the drain electrode 21, as well as the source electrode 23 and the drain electrode 21.

Subsequently, a silicon nitride film is deposited to a thickness of 300 nm using plasma CVD, and photolithographically patterned and dry etched to form the insulating film (protective film) 31 with the contact hole 25 passing therethrough. The silicon nitride insulating film 31 functions as a protective film for the thin film transistor substrate.

Subsequently, ITO that is a transparent oxide is sputtered to form an 80 nm thick film, which will be shaped into the pixel electrodes 16, 17 and terminal electrodes. Then, the ITO film is photolithographically patterned and wet etched to simultaneously form the terminal electrodes and pixel electrodes 16, 17. The terminal electrodes are connected to the gate bus line and drain bus line via contact holes (not shown), and the sub-pixel electrode 16 is connected to the source electrode 22 via the contact hole 25. Finally, the entire structure is annealed at a temperature of about 200 degrees for two hours to complete the manufacture of the thin film transistor substrate (TFT substrate).

While the above manufacturing method of the thin film transistor substrate shows one example of wiring materials, structures, and film thicknesses, other various combinations are possible. For example, the gate wiring may be a single metal layer formed of Al and Al alloys, Cr (chromium), or Mo, or may be Al and Al alloys with Ti stacked thereon, which is then patterned using dry etching.

Moreover, instead of using a metal such as Mo alone, MoN or MoO may be combined as appropriate by sputtering in an atmosphere including nitrogen or oxygen for increased manufacturability of Al/Mo during wet etching and decreased diffusion. Furthermore, although ITO is used as the transparent conductive film, other transparent conductive films such as ZnO (zinc oxide) or IZO (indium zinc oxide) may be used.

While the method for manufacturing the channel etch type thin film transistor substrate has been described above, the use of a halftone mask may eliminate parts of the lithography processes as described above, that is, the process of patterning the island semiconductor layer and the following process of patterning the metal layer for the source and drain (and bus lines) to separate the elements.

The thin film transistor substrate and the liquid crystal display panel according to this embodiment provide the following advantages. First, since capacitance is formed where conventionally the source electrode and the pixel electrode are connected via a contact hole, excessively opaque wiring is not required, which ensures sufficient effective area and transmittance of a pixel. Second, no particular additional capacitive electrode or transparent capacitive electrode is required, resulting in no extra process steps. Third, elimination of the gap between sub-pixel electrodes conventionally required ensures sufficient effective area and transmittance of a pixel. Fourth, sub-pixels located on the opposite sides of the gate bus line and drain bus line prevent potential short circuit due to pattern defects. Fifth, a simpler pixel structure results in greater freedom in pixel design.

Second Embodiment

Figure 3:
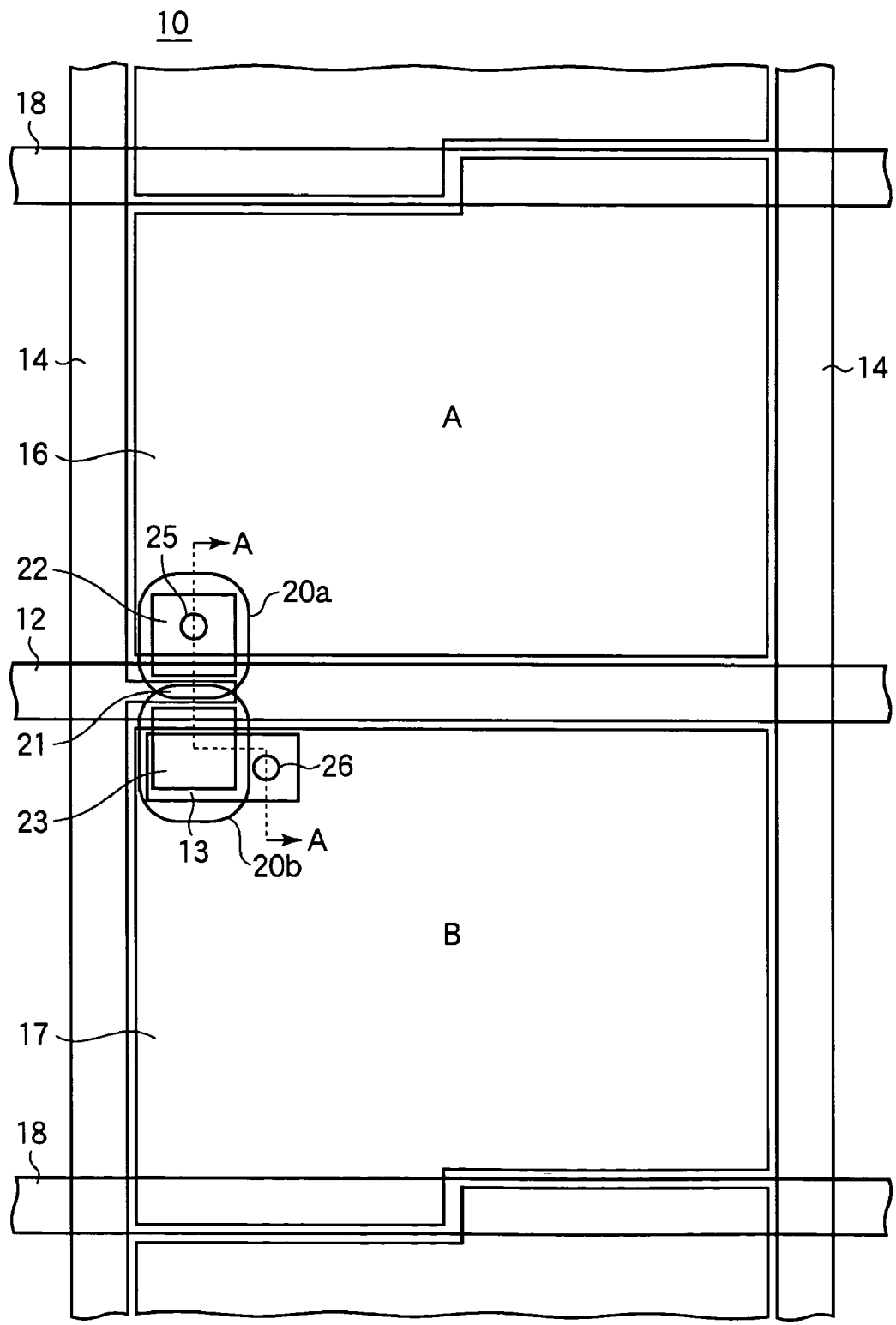
FIG. 3 shows the configuration of one pixel of the thin film transistor substrate according to the second embodiment of the invention.
Figure 4:
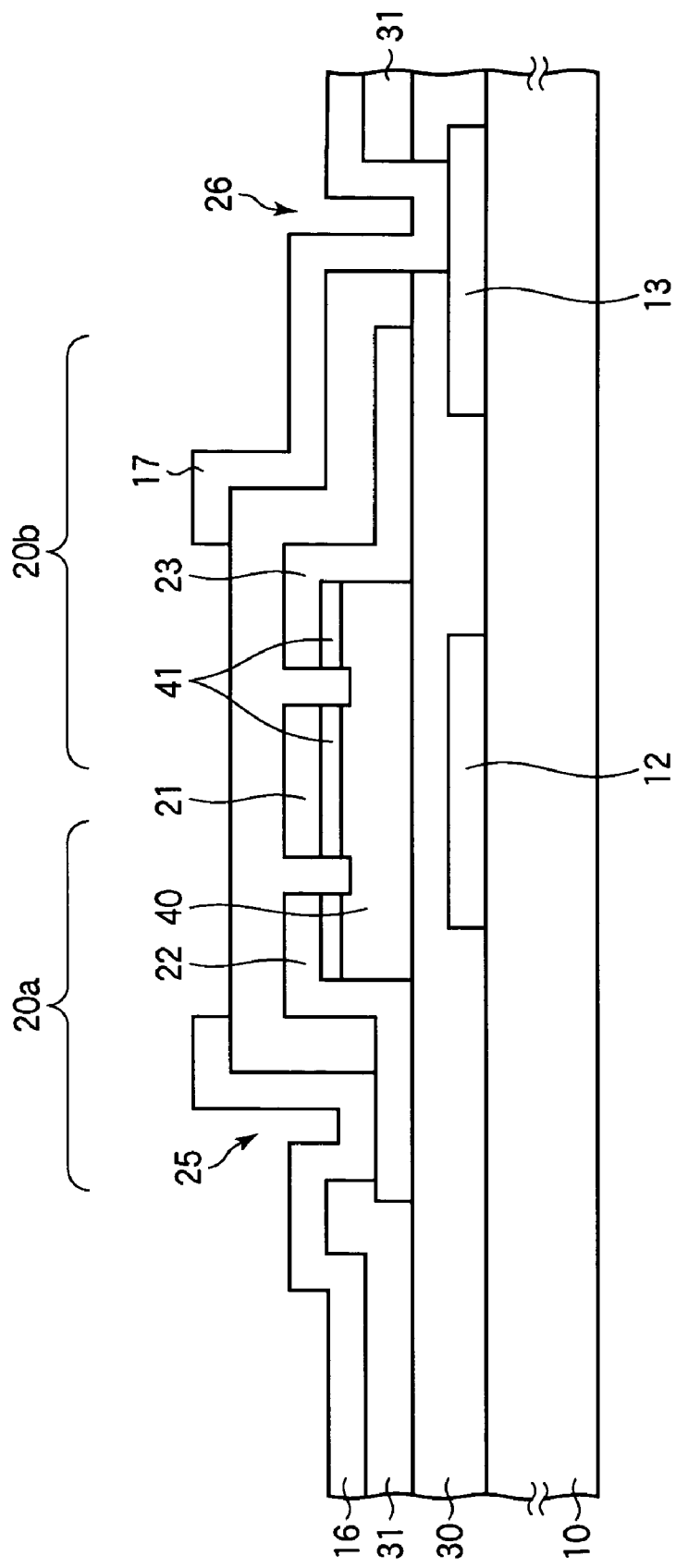
FIG. 4 shows in cross-section the configuration of one pixel of the thin film transistor substrate according to the second embodiment of the invention.

The thin film transistor substrate according to a second embodiment of the invention will be described with reference to FIGS. 3 and 4. FIG. 3 shows the configuration of one pixel of the thin film transistor substrate according to this embodiment. FIG. 4 is a cross-sectional view taken along the line A-A shown in FIG. 3. In the following description of the thin film transistor substrate and the like, the components providing the same functions and effects as those of the first embodiment are denoted with the same characters and a detailed description thereof will be omitted.

In the sub-pixel region B of the thin film transistor substrate according to this embodiment, an independent electrode 13 is formed in a layer under the source electrode 23 of the TFT 20b via the gate insulating film 30. The independent electrode 13 is simultaneously formed in the same layer as the gate bus line 12 in the formation process thereof. The source electrode 23 overlaps with the independent electrode 13 via the gate insulating film 30 when viewed toward the normal to the panel surface, forming a capacitor with the gate insulating film 30 in the overlapping portion as a capacitance film. A contact hole 26 is formed in the gate insulating film 30 and the insulating film (protective film) 31 above the independent electrode 13, and the independent electrode 13 and the sub-pixel electrode 17 are directly connected via the contact hole 26.

This embodiment not only provides similar advantages to the first embodiment and forms capacitance between the sub-pixel electrode 17 and the source electrode 23, but also forms capacitance between the independent electrode 13 and the source electrode 23.

Third Embodiment

Figure 5:
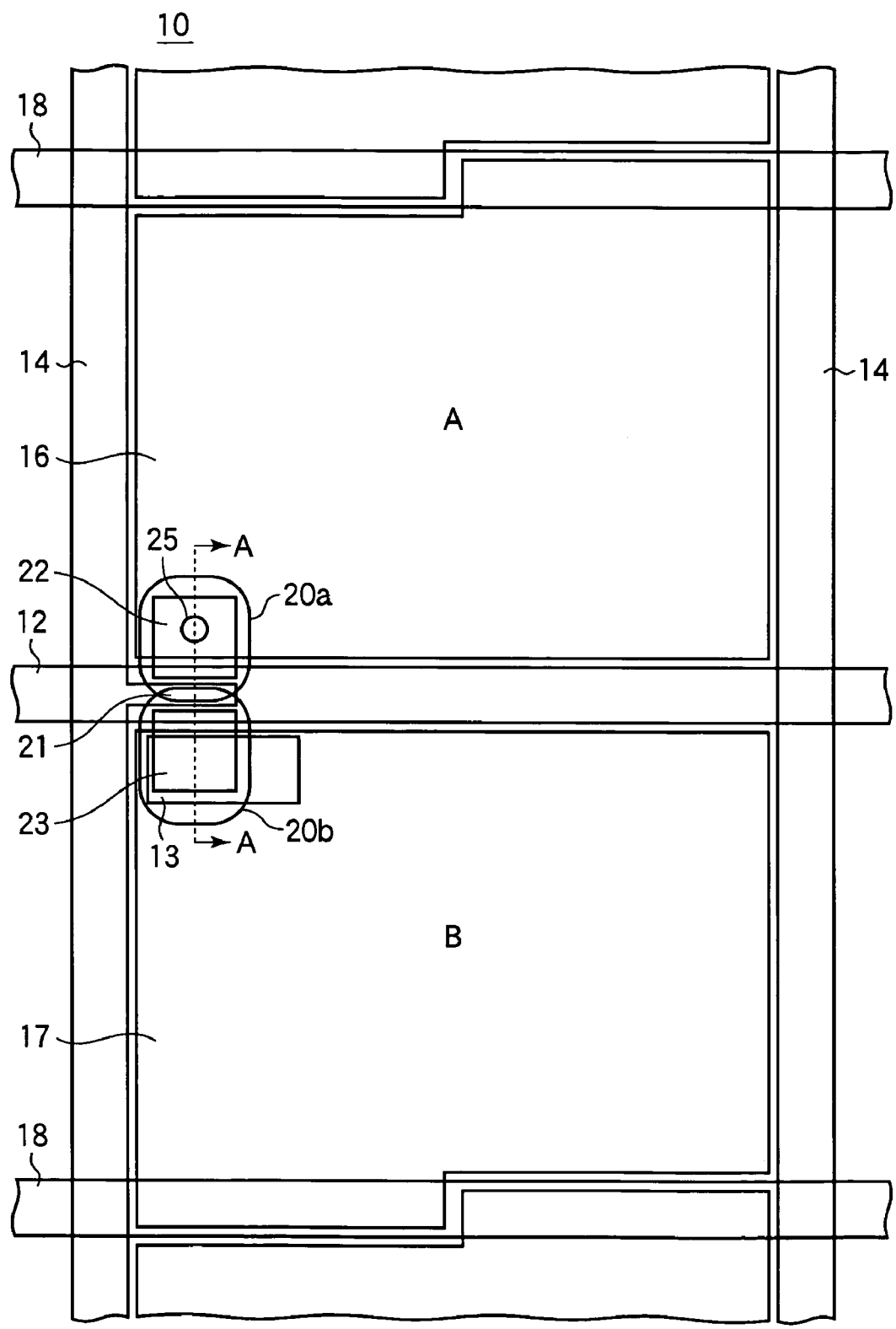
FIG. 5 shows the configuration of one pixel of the thin film transistor substrate according to the third embodiment of the invention.
Figure 6:
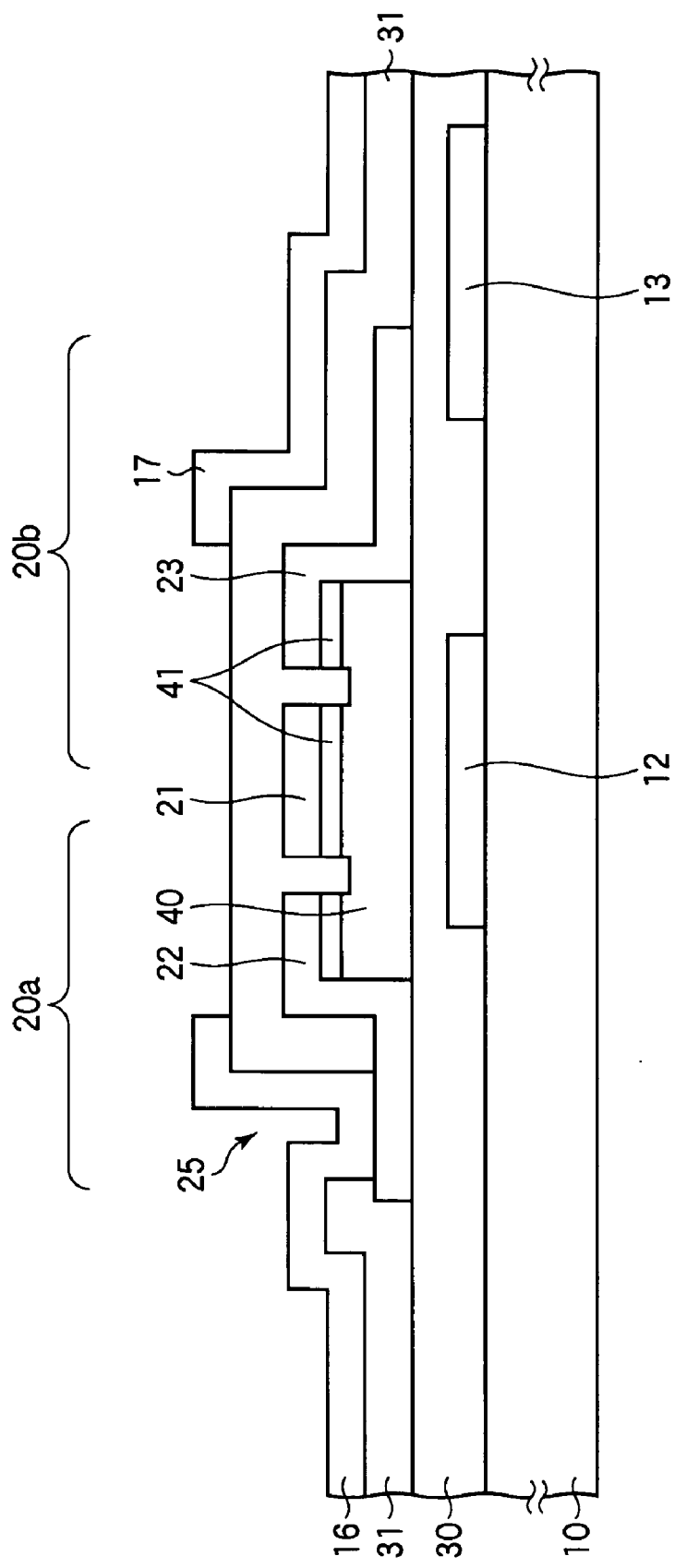
FIG. 6 shows in cross-section the configuration of one pixel of the thin film transistor substrate according to the third embodiment of the invention.

The thin film transistor substrate according to a third embodiment of the invention will be described with reference to FIGS. 5 and 6. FIG. 5 shows the configuration of one pixel of the thin film transistor substrate according to this embodiment. FIG. 6 is a cross-sectional view taken along the line A-A shown in FIG. 5.

In the sub-pixel region B of the thin film transistor substrate according to this embodiment, an independent electrode 13 is formed in a layer under the source electrode 23 of the TFT 20b via the gate insulating film 30. The independent electrode 13 is simultaneously formed in the same layer as the gate bus line 12 in the formation process thereof. The source electrode 23 overlaps with the independent electrode 13 via the gate insulating film 30 when viewed toward the normal to the panel surface, forming a capacitor with the gate insulating film 30 in the overlapping portion as a capacitance film. In this embodiment, however, unlike the second embodiment, the independent electrode 13 does not establish direct electrical connection with the sub-pixel electrode 17, but forming a floating electrode. This embodiment also not only provides similar advantages to the first embodiment and forms capacitance between the sub-pixel electrode 17 and the source electrode 23, but also forms capacitance between the independent electrode 13 and the source electrode 23.

The invention is not limited to the above embodiments but various variations thereof are possible. For example, although the above embodiments have been described with reference to the thin film transistor substrate using channel etch type TFTs, the invention is not limited thereto but may also be applied to a thin film transistor substrate using channel protection film type TFTs in which a protective film is formed on the channel region.

What is claimed is:

1. A thin film transistor substrate comprising:
   first and second bus lines intersecting each other with an insulating film therebetween and located above a transparent insulating substrate;
   first and second sub-pixel electrodes located on the opposite sides of the first bus line;
   a first thin film transistor that establishes direct electrical connection with the first sub-pixel electrode; and
   a second thin film transistor capacitively coupled to the second sub-pixel electrode, wherein said capacitive coupling is in a portion of the insulating film at which there is overlap between the second thin film transistor and the second sub-pixel electrode.

2. The thin film transistor substrate according to claim 1, wherein the first bus line is a gate bus line that establishes direct electrical connection with gate electrodes of the first and second thin film transistors; and
   the second bus line is a drain bus line that establishes direct electrical connection with drain electrodes of the first and second thin film transistors.

3. The thin film transistor substrate according to claim 2, wherein a source electrode of the first thin film transistor establishes direct electrical connection with the first sub-pixel electrode; and
   a source electrode of the second thin film transistor overlaps with the second sub-pixel electrode when viewed toward the normal to the surface of the source electrode, forming a first capacitor via the insulating film in the overlapping portion.

4. The thin film transistor substrate according to claim 3, wherein a part of the gate bus line also serves as the gate electrodes of the first and second thin film transistors; and
   the drain electrode is formed such that it protrudes from the drain bus line above the gate electrode when viewed toward the normal to the transparent insulating substrate and used as the common drain electrode for the first and second thin film transistors.

5. The thin film transistor substrate according to claim 3, wherein the insulating film in the overlapping portion is a capacitance film, the insulating film in the overlapping portion covering the top of the source electrode of the second thin film transistor.

6. The thin film transistor substrate according to claim 3, further comprising an independent electrode formed in the same layer as the gate bus line, the independent electrode overlapping with the source electrode of the second thin film transistor forming a second capacitor with the insulating film in the overlapping portion as a capacitance film and establishing direct electrical connection with the second sub-pixel electrode.

7. The thin film transistor substrate according to claim 3, further comprising an independent electrode formed in the same layer as the gate bus line, the independent electrode overlapping with the source electrode of the second thin film transistor forming a second capacitor with the insulating film in the overlapping portion as a capacitance film and capacitively coupled to the second sub-pixel electrode.

8. A liquid crystal display panel comprising:
   the thin film transistor substrate according to claim 1;
   a counter substrate facing the thin film transistor substrate and having counter electrodes formed on a transparent insulating substrate; and
   a liquid crystal layer sandwiched between the thin film transistor substrate and the counter substrate.

* * * * *